United States Patent
Chu et al.

(10) Patent No.: US 6,795,740 B1
(45) Date of Patent: Sep. 21, 2004

(54) RECTIFYING OVERFLOW AND UNDERFLOW IN EQUALIZED AUDIO WAVEFORMS

(75) Inventors: Ke Chiang Chu, Saratoga, CA (US); Hong Kaura, San Jose, CA (US); James Peter Hoddie, Mountain View, CA (US)

(73) Assignee: Apple Computer, Inc., Cupertino, CA (US)

(*) Notice: Subject to any disclaimer, the term of this patent is extended or adjusted under 35 U.S.C. 154(b) by 0 days.

(21) Appl. No.: 09/516,387

(22) Filed: Mar. 1, 2000

(51) Int. Cl.$^7$ .............................................. G06E 17/00
(52) U.S. Cl. ........................ 700/94; 381/102; 381/104; 381/94.8
(58) Field of Search ........................... 700/94; 381/111, 381/102, 104, 107, 94.8; 333/14; 455/72

(56) References Cited

U.S. PATENT DOCUMENTS

| | | | |
|---|---|---|---|
| 3,631,365 A | 12/1971 | Dolby | 333/14 |
| 3,846,719 A | 11/1974 | Dolby | 333/14 |
| 4,249,042 A | 2/1981 | Orban | 179/15.55 R |
| 4,398,061 A * | 8/1983 | McMann, Jr. | 381/94.8 |
| 4,498,060 A | 2/1985 | Dolby | 333/14 |
| 4,507,791 A | 3/1985 | Gundry | 375/27 |
| 4,757,540 A | 7/1988 | Davis | 381/34 |
| 4,843,626 A | 6/1989 | Werrbach | 381/107 |
| 4,922,535 A | 5/1990 | Dolby | 381/29 |
| 5,168,526 A | 12/1992 | Orban | 381/94 |
| 5,509,080 A | 4/1996 | Roberts | 381/98 |
| 5,581,480 A | 12/1996 | Olson et al. | 364/514 R |
| 5,714,918 A | 2/1998 | Menkhoff | 333/28 R |
| 5,850,453 A | 12/1998 | Klayman et al. | 381/1 |
| 5,881,157 A | 3/1999 | Lee et al. | 381/98 |
| 5,892,830 A | 4/1999 | Klayman | 381/1 |
| 5,892,832 A | 4/1999 | Beyer et al. | 381/320 |
| 5,892,833 A | 4/1999 | Maag et al. | 381/98 |

FOREIGN PATENT DOCUMENTS

| | | | | |
|---|---|---|---|---|
| JP | 4110684904 A | * | 3/1999 | H03G/7/00 |

* cited by examiner

Primary Examiner—Melur Ramakrishnaiah
(74) Attorney, Agent, or Firm—Fenwick & West, LLP

(57) ABSTRACT

The invention is a method, apparatus and computer readable program for eliminating overflow and underflow by re-adjusting or rectifying the audio levels of an audio signal in those portions where overflow/underflow occurs.

In a first preferred embodiment a single stage scale down solution is provided in starting and end points of the overflow/underflow areas in the audio signal are detected, and a number of discrete sampling points along the audio signal curve between these two points are adjusted by a predetermined multiplier in order to reduce the positive level (in the case of overflow) or negative level (in the case of underflow) of each discrete sampling point. Using the single stage scale down solution of the present invention, a new audio signal is created having no overflow/underflow, yet maintaining the former generally smooth shape of the audio signal waveform and signal characteristics, without completely clipping the audio levels.

In a second preferred embodiment a multi-stage scale down solution is provided in which the overflow/underflow is divided into sections, such that the discrete sampling points in one section may be adjusted by a first multiplier in order to reduce their audio levels; while discrete sampling points in another, section may be adjusted by a second multiplier (which is preferably different than the first multiplier) in order to reduce their audio levels. Accordingly, a new audio signal is constructed with reduced overflow/underflow, yet maintaining a generally smooth signal curve and characteristics, without completely clipping the audio levels.

46 Claims, 11 Drawing Sheets

RECTIFYING OVERFLOW AND UNDERFLOW IN EQUALIZED AUDIO WAVEFORMS

FIELD OF THE INVENTION

The present invention relates generally to the field of audio signal processing. More specifically, the invention relates to an improved method, apparatus or computer program product for rectifying overflow/underflow in audio signal processing applications.

BACKGROUND OF THE INVENTION

Sound editing and signal processing applications are well known in the art and there are a number of sound editing/signal processing software packages available in the market, including SoundEdit 16 from Macromedia, Peak from Bias, or WavesConvert Pro from KS Waves. In conventional sound editing/signal processing applications, it is often desirable to increase the amplitude, power, or signal level of either the overall audio signal, or certain portions thereof. In a typical sound editing application, an equalizer is used to boost the amplitude or signal level of the entire audio signal, or portions of the audio signal which fall within specific frequency bands. However, when the amplitude or signal level of the overall audio signal, or portions of the audio signal falling within specific frequency bands is increased, the resulting amplitude or power level of the audio signal may exceed a maximum allowable amplitude or power level in certain portions of the audio signal. Alternatively, the audio signal may fall below a minimum amplitude or power level in certain portions of the resulting audio signal. Under these circumstances, the equalized audio signal is said to contain overflow and/or underflow.

FIG. 1 illustrates the concept of overflow and underflow. As shown in FIG. 1 an audio signal exceeds an acceptable maximum positive audio level 100 in those areas 101 and 102 which are designated as overflow. Moreover, the audio exceeds an acceptable maximum negative audio level 150 in that area 103 designated as underflow. It is understood that overflow/underflow may be caused by other sound-editing applications, such as amplification, emphasis, or normalization. Overflow/underflow is a very undesirable phenomenon in any type of audio signal environment since it creates significant signal distortion and generates an annoying buzz/cracking sound. Accordingly, it is desirable to minimize, or to reduce the effect of overflow/underflow in audio signal applications.

Prior art sound editing/signal processing software packages, such as the SoundEdit 16 software package from Macromedia, reduce the effect of overflow/underflow by simply clipping audio levels where overflow/underflow occurs to the maximum allowable positive or negative signal levels. FIG. 2 illustrates the concept of clipping the audio level of an audio signal to maximum allowable positive or negative signal levels. As shown in FIG. 2, an equalized audio signal is clipped to a maximum allowable positive audio level at sections 201 and 202 (where the dashed lines indicate the unclipped original signal level and the solid lines represent the clipped signal level). The audio signal in FIG. 2 is also clipped to a maximum allowable negative audio level at section 203 (where the dashed line indicates the unclipped signal level and the solid line represents the clipped signal level).

The process of clipping the audio level of an audio signal after boosting the audio signal is a very simple approach and is used by most conventional sound-editing applications. However, the resulting or clipped audio signal suffers non-smooth changes in audio levels over time, along with significant signal loss, which typically creates an obvious and unpleasant rattling sound in the resulting audio signal.

Accordingly, what is needed is a more efficient technique for eliminating overflow/underflow in audio signal processing without clipping the audio signal in order to maintain the original audio signal characteristics and general shape of the waveform as much as possible.

SUMMARY OF THE INVENTION

The invention is a method, apparatus and computer readable program for eliminating overflow and underflow by re-adjusting or rectifying the audio levels of an audio signal in those portions where overflow/underflow occurs. Preferably, this is done after the signal has been bocisted by some other audio signal processing application, such as an equalizer.

In a first preferred embodiment a single stage scale down solution is provided which can handle overflow/underflow up to a predetermined value or degree. In this embodiment, the starting and end points of the overflow/underflow areas in the audio signal are detected, and a number of discrete sampling points along the audio signal curve between these two points are adjusted by a predetermined multiplier in order to reduce the positive level (in the case of overflow) or negative level (in the case of underflow) of each discrete sampling point. Preferably, the single stage scaling solution is used to correct overflow/underflow of up to 10 dB, although it is understood that it may be used to correct overflow/underflow greater than 10 db. Using the single stage scale down solution of the present invention, a new audio signal is created having no overflow/underflow, yet maintaining the former generally smooth shape of the audio signal waveform and signal characteristics, without completely clipping the audio levels.

In a second preferred embodiment a multi-stage scale down solution is provided which can handle overflow/underflow greater than a predetermined value. Preferably the multi-stage scale down solution is used to rectify audio signals having overflow/underflow greater than 10 db, although it is understood that the multi-stage scaling solution may be used to correct overflow/underflow less than 10 db.

In a preferred embodiment of the multi-stage scale down solution, the starting and ending points of the overflow/underflow areas are detected. The audio signal waveform located between the starting and ending points of the overflow/underflow is then divided into a number of sections. A number of discrete sampling points along the signal curve in each of the sections are then adjusted by a select multiplier in order to reduce the positive level (in the case of overflow) or negative level (in the case of underflow) of each sampling point. Each section may preferably have a different select multiplier, such that the discrete sampling points in one section may be adjusted by a first multiplier in order to reduce their audio levels; while discrete sampling points in another section may be adjusted by a second multiplier (which is preferably different than the first multiplier) in order to reduce their audio levels. Accordingly, a new audio signal is constructed with reduced overflow/underflow, yet maintaining a generally smooth signal curve and characteristics, without completely clipping the audio levels.

DETAILED DESCRIPTION OF PREFERRED EMBODIMENT

The invention is a novel apparatus, computer readable software program and method for eliminating signal overflow or underflow in audio signal processing applications, such as equalization or amplification. The invention may be implemented through software, firmware, or hardware having any member of modules designed to eliminate signal overflow and underflow. In a first preferred embodiment, the present invention offers a single stage scale down solution for solving overflow/underflow below a predetermined value. Preferably, the predetermined value is chosen such that most overflow/underflow occurrences can be effectively rectified using the single stage scale down solution—e.g. a predetermined value of up to 10 dB.

In the single stage scale down solution, a pair of positive-negative threshold levels are chosen which are less than a maximum allowable positive audio signal level at which overflow occurs and a maximum allowable negative audio signal level at which underflow occurs. Preferably, the positive and negative threshold levels have the same dB differential from the maximum positive and maximum negative allowable audio signal levels, respectively. In order to correct overflow using the single stage scaling solution, the portion of the audio signal which exceeds the positive threshold level is rectified using an overflow scaling factor. In order to correct underflow using the single stage scaling solution, the portion of the audio signal which exceeds the negative threshold level is rectified using an underflow scaling factor.

In a second preferred embodiment, a multi-stage scale down solution is provided which can handle overflow/underflow greater than a predetermined value—e.g. overflow/underflow greater than 10 dB. In this embodiment, starting and end points of the overflow/underflow areas are detected. Portions of the audio signal between the starting and ending points of the overflow/underflow are then divided into a number of sections. A number of discrete sampling points along the signal curve in each of the sections are then adjusted by a select multiplier which reduces the value of each sampling point. Each section may have a different select multiplier, such that sampling points in one section are adjusted by a first multiplier in order to reduce their audio levels; while sampling points in another section are adjusted by a second multiplier (which is different than the first multiplier) in order to reduce their audio levels. Accordingly, after the audio levels of each sampling point in the overflow/underflow have been reduced, a new audio signal is constructed, having a smooth signal curve with reduced overflow/underflow without clipping the audio signal levels.

Single Stage Scaling Solution

Figure 1:
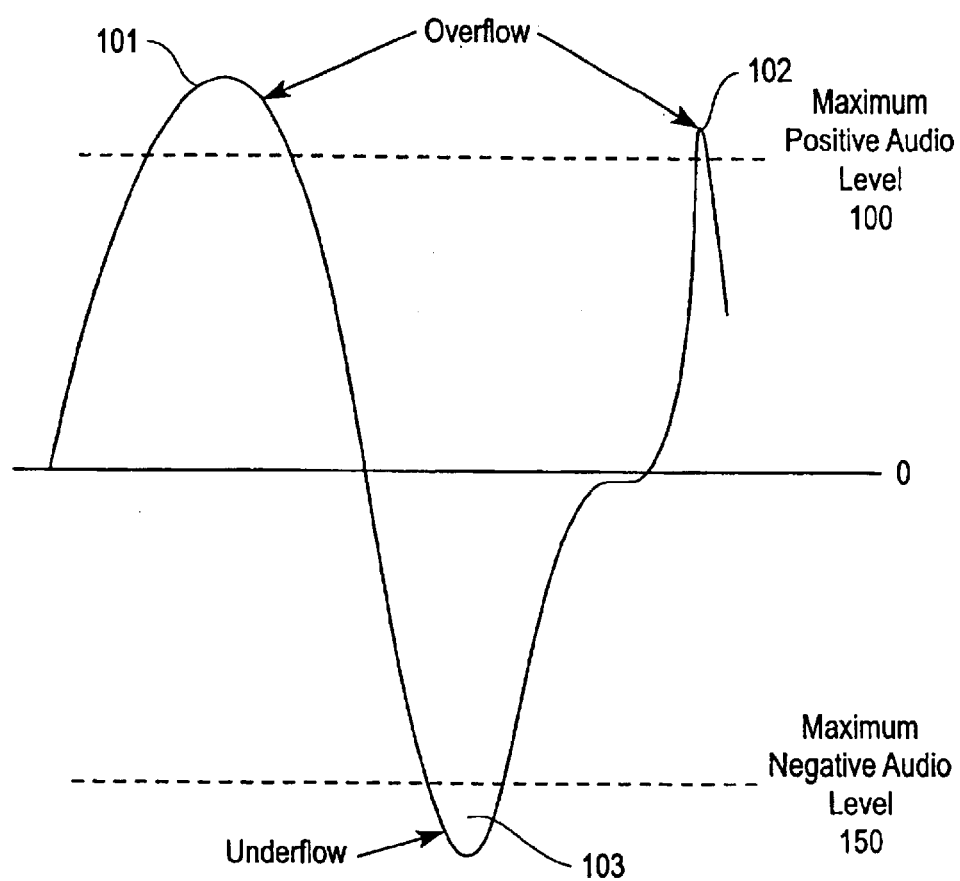
FIG. 1 illustrates the concept of overflow and underflow in audio signal processing applications.
Figure 2:
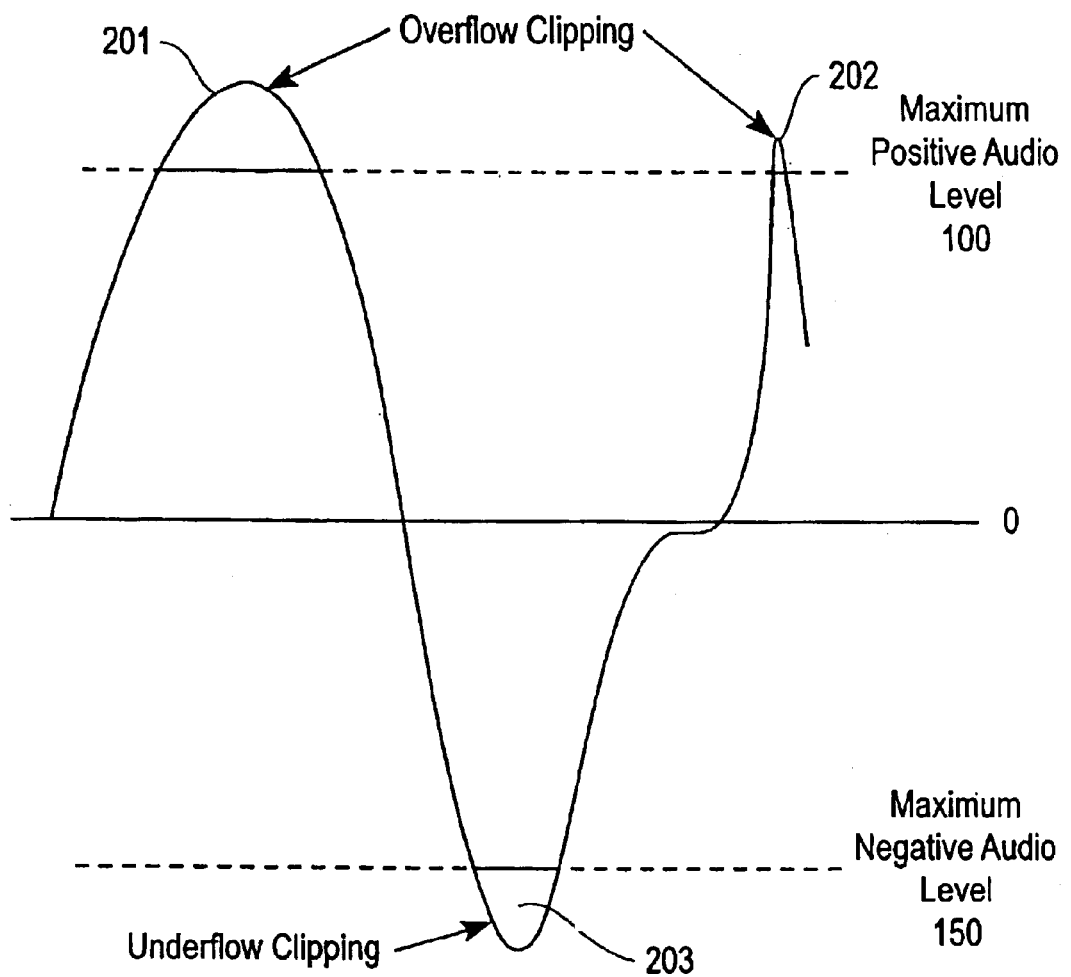
FIG. 2 illustrates a prior art technique for eliminating overflow/underflow by clipping the audio signal.
Figure 3:
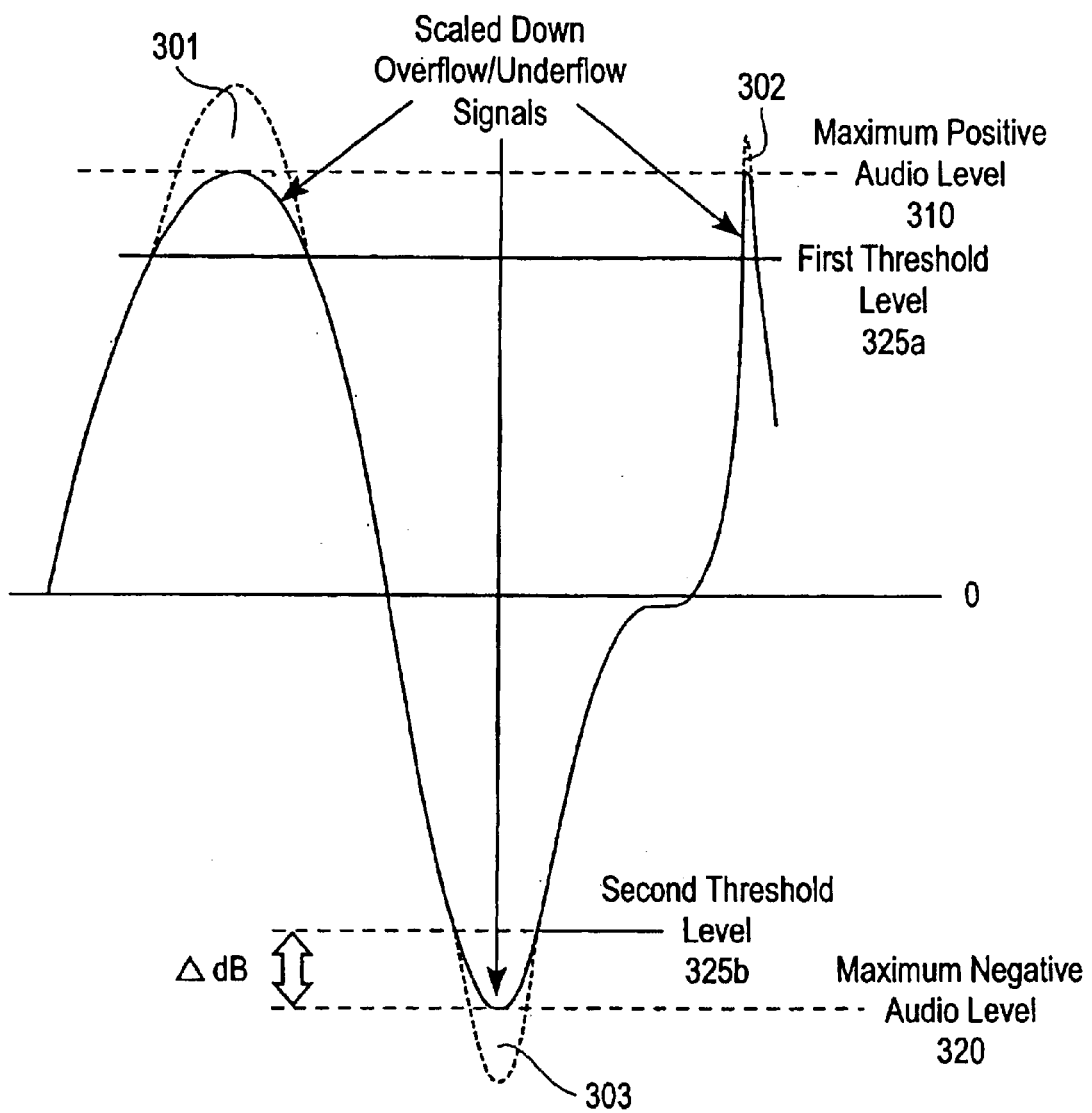
FIG. 3 illustrates a single stage scale down technique for solving overflow/underflow in accordance with a preferred embodiment of the present invention.

FIG. 3 illustrates a single stage scale down technique for solving overflow/underflow in accordance with a preferred embodiment of the present invention. As shown, overflow 301 and 302 is detected in the audio signal waveform where the audio signal waveform exceeds a maximum allowable positive signal level 310. Underflow 303 is detected where the audio signal waveform exceeds a maximum allowable negative signal level 320. It is understood that the maximum allowable positive and negative signal levels 310 and 320 are system constraints which are dependent upon the entire audio system in which the audio signals are to be recorded and played back.

Based upon the maximum allowable positive and negative signal levels 310 and 320, positive and negative threshold levels 325a–b are chosen. Preferably, the positive and negative threshold levels 325a–b are chosen at equal intervals ΔdB from the maximum allowable positive and negative audio signal levels 310 and 320, such that the positive threshold level 325a is less than the maximum allowable positive audio signal level 310 by some amount ΔX dB and the negative threshold level 325b is less than the maximum allowable negative audio signal level 320 by the same amount of ΔX dB.

It is understood that a smaller difference between the threshold levels and the maximum allowable levels means less waveform alternation—i.e. less of the audio waveform will be attenuated as further described herein. However, a smaller difference also means the attenuation is distributed over a shorter time period. Likewise, a larger difference between the threshold levels and the maximum allowable levels means more waveform alternation—i.e. more of the audio waveform will be attenuated as further described herein. However, a larger difference also means that the attenuation is distributed over a longer time period. Accordingly, the thresholds are preferably chosen in order to achieve the optimal balance between distribution over time and degree of attentuation needed.

Figure 4:
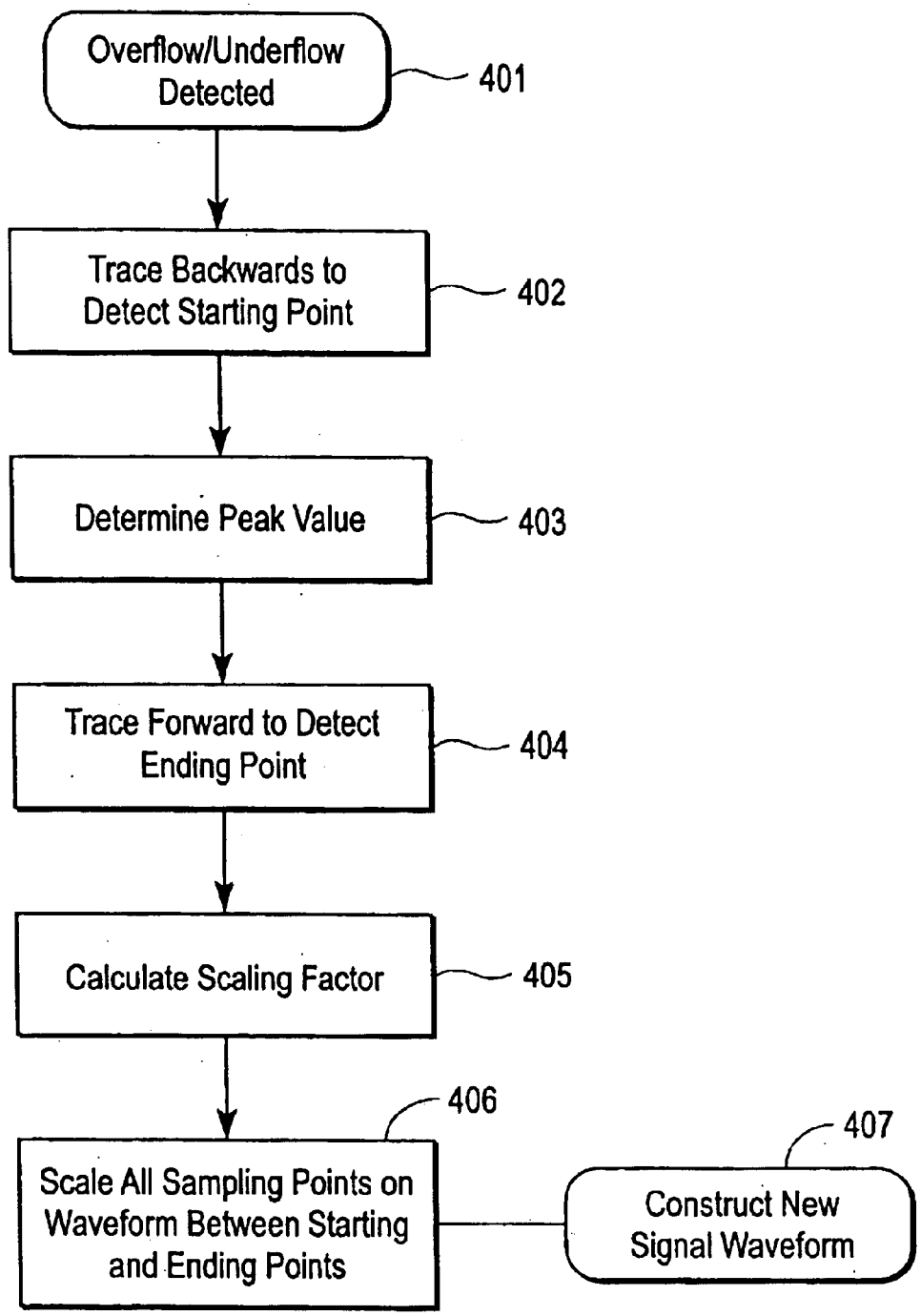
FIG. 4 illustrates each step in a preferred embodiment of the process or method for rectifying overflow/underflow using the single step solution in accordance with the present invention.

The single stage scaling process for correcting overflow/underflow will be described with reference to FIG. 4 which illustrates each step in a preferred embodiment of the process or method for rectifying overflow/underflow using the single step scale down solution in accordance with the present invention.

Once overflow/underflow is detected (Step 401)—i.e. once the audio signal exceeds either the maximum allowable positive or negative audio signal levels, the next step in the process of rectifying the overflow/underflow is to detect a starting point (402). The starting point serves as the beginning point for a preferred single step scaling of the overflow/underflow portion of the audio signal. The starting point is defined as the point where the amplitude of the audio signal equals the positive or negative threshold level when tracing backwards along the audio signal waveform from the point where the overflow/underflow was first detected.

Once the starting point is found, the next step in the process of rectifying the overflow/underflow is to determine a maximum peak value in the underflow or overflow (403). The maximum peak value is the point of greatest positive or negative magnitude in the overflow/underflow. Once the maximum peak value in the overflow or underflow has been detected, the next step is to detect an ending point (404). The ending point serves as the last point where the single step scaling of the audio signal occurs. The ending point is defined as the point where the audio signal is equal to the positive or negative threshold level when tracing forward along the audio signal waveform from a maximum peak value in the overflow/underflow. As explained earlier, the maximum peak value is the point of greatest positive or negative amplitude in the overflow/underflow portion.

After the starting point and ending point for the single step scaling are found, an overflow/underflow scaling factor is calculated (405). The overflow/underflow scaling factor is preferably equal to the maximum allowable positive or negative signal level less the positive or negative threshold level, divided by the maximum peak value in the overflow/underflow less the positive or negative threshold level:

overflow/underflow scaling factor=(maximum positive or negative signal level−positive or negative threshold level)/(maximum positive or negative peak value−positive or negative threshold level)

Once the overflow/underflow scaling factor has been determined, the original amplitude for each of the sampling points of the audio signal which fall between the starting point and the ending point, also referred to as the scaling zone, are scaled down to a new scaled amplitude, thereby creating a new signal curve for the audio signal within the scaling zone (406). Preferably, the amplitude for each of the sampling points which fall in the scaling zone are scaled down to the new scaled amplitude using the following formula:

New scaled amplitude=(original amplitude−positive/negative threshold value)*overflow/underflow scaling factor+positive/negative threshold value Accordingly, after the audio levels of each sampling point in the overflow/underflow have been reduced, a new audio signal is constructed, having a smooth signal curve with reduced overflow/underflow without completely clipping the audio signal levels (407).

Multi-Stage Scaling Solution

In an second preferred embodiment a multi-stage scaling solution may be needed to insure a smoother signal transition and preserve the original signal characteristics as much as possible when the overflow/underflow is very large. This embodiment is particularly useful where the peak value in the overflow/underflow exceeds the maximum allowable positive or negative audio signal levels by more than a predetermined value of the single stage scaling solution. In a multi-stage embodiment, the overflow/underflow portions of the audio signal are each divided into multiple stages and each stage is individually scaled using a variable scaling factor. Each stage may have a different variable scaling factor, such that one stage may be adjusted or rectified using a first scaling factor in order to reduce the audio level for that stage; while another stage may be adjusted by a second scaling factor (which is different from the first scaling factor) in order to adjust or rectify the audio level of the signal in that stage.

Figure 5:
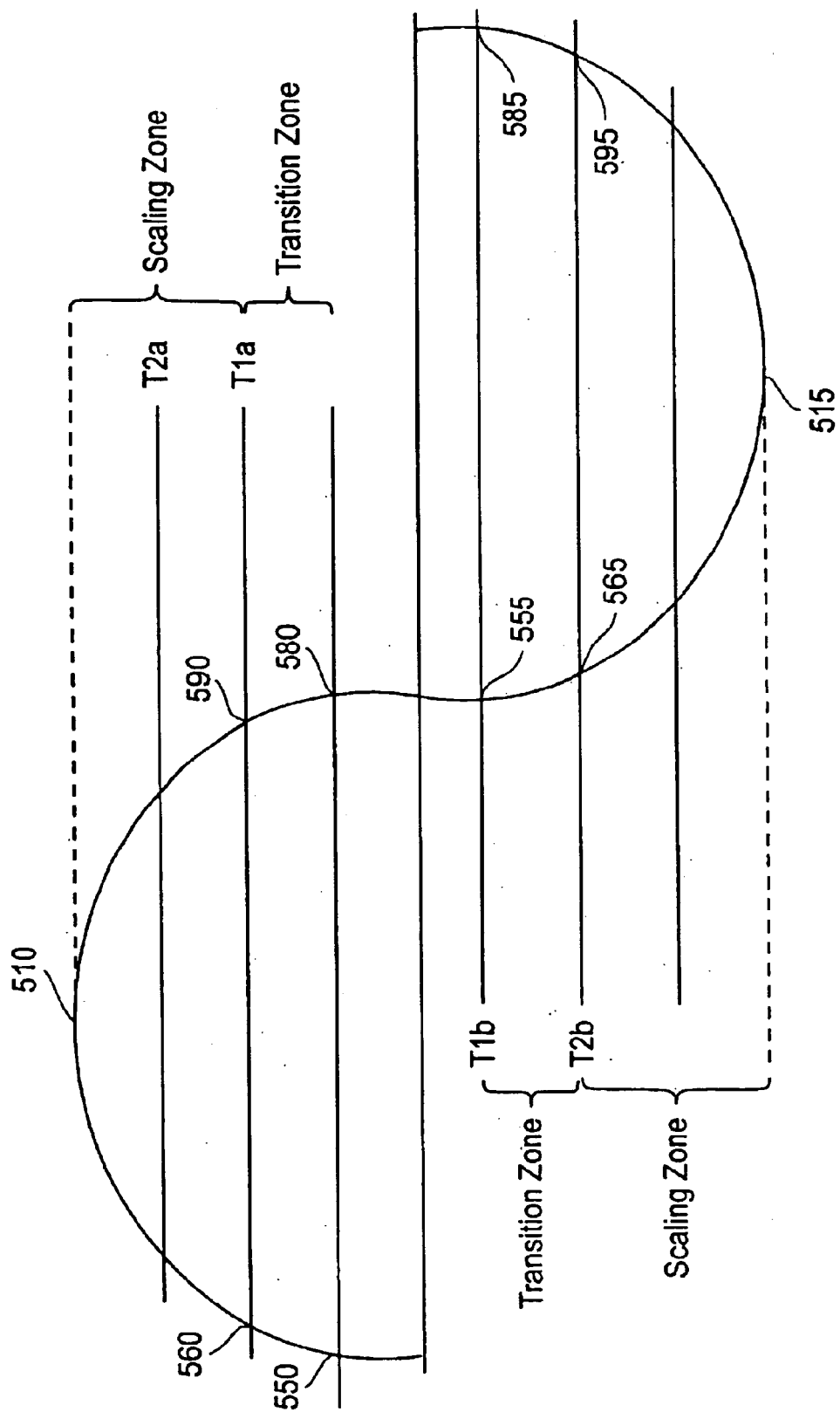
FIG. 5 illustrates a preferred embodiment of the multi-stage scaling solution using two stages.

FIG. 5 illustrates a preferred embodiment for rectifying overflow or underflow using the a multi-stage scaling process in accordance with a preferred embodiment of the present invention. In FIG. 5, two-stage scaling for rectifying overflow or underflow is illustrated. It is understood that higher-stage solutions (more than two stages) may be utilized in this preferred embodiment and the following description is intended only as example in order to better illustrate the multi-stage solution In the multi-stage solution illustrated in FIG. 5, the signal has overflow/underflow. In order to rectify the overflow/underflow, the portion of the signal which has overflow/underflow is divided into two separate stages, and each stage is rectified individually. Preferably, the overflow/underflow is divided into separate stages such that each stage has an equal degree of amplitude or magnitude change. In order to divide the overflow/underflow portion of the signal into two different stages, first and second positive threshold values are chosen for the overflow (T1$a$ and T2$a$) and first and second negative threshold values are chosen for the underflow (T1$b$ and T2$b$). Portions of the audio signal which fall between T1$a$ and T2$a$ or T1$b$–T2$b$ each define a first stage in either the overflow or underflow, respectively. Meanwhile, portions of the audio signal which fall between T2$a$ and the maximum positive peak value 510, or between T2$b$ and the maximum negative peak value 515, each define a second stage in either the overflow or the underflow, respectively.

Preferably, the threshold levels T1$a$–$b$ and T2$a$–$b$ are chosen at equal intervals from the maximum allowable positive or negative audio signal levels 505 or 525 such that the first threshold levels T1$a$–$b$ are less than the maximum allowable positive or negative audio signal levels by some amount ΔX dB and the second threshold levels T2$a$–$b$ are each less than the maximum allowable positive or negative audio signal levels by a fraction of the amount ΔX dB, wherein the fraction is equal to (m/n) wherein m is equal to the stage number—i.e. the first stage, the second stage, the third stage, etc., and n is equal to the total number of stages. Accordingly, in the two stage example shown in FIG. 4, the second thresholds T2$a$–$b$ are positioned half way between the first threshold levels T1$a$–$b$ and the maximum allowable positive or negative audio signal level 505 and 525, respectively.

Preferably, for a 16 bit sound system, the amount ΔX dB may vary from the maximum allowable positive and negative signal levels 505 and 525 by 6000 to 28000 for most overflow cases and −6000 to −28000 for most underflow cases. It is understood that the closer the threshold levels are to the maximum allowable positive or negative signal levels (i.e. the smaller the amount ΔX dB) means less waveform alteration—i.e. less of the audio waveform will be attenuated or rectified as further described herein. However, the closer the threshold levels are also means the attenuation is distributed over a shorter time period. Likewise, the further away from the maximum allowable positive or negative signal levels (i.e. the larger the amount ΔX dB) means more waveform alteration—i.e. more of the audio waveform will be attenuated or rectified as further described herein. However, the further away the thresholds also means that the attenuation is distributed over a longer time period. Accordingly, the first and second positive/negative thresholds T1$a$–$b$ and T2$a$–$b$ are preferably chosen in order to achieve the optimal balance between distribution over time and degree of attenuation needed.

Figure 6:
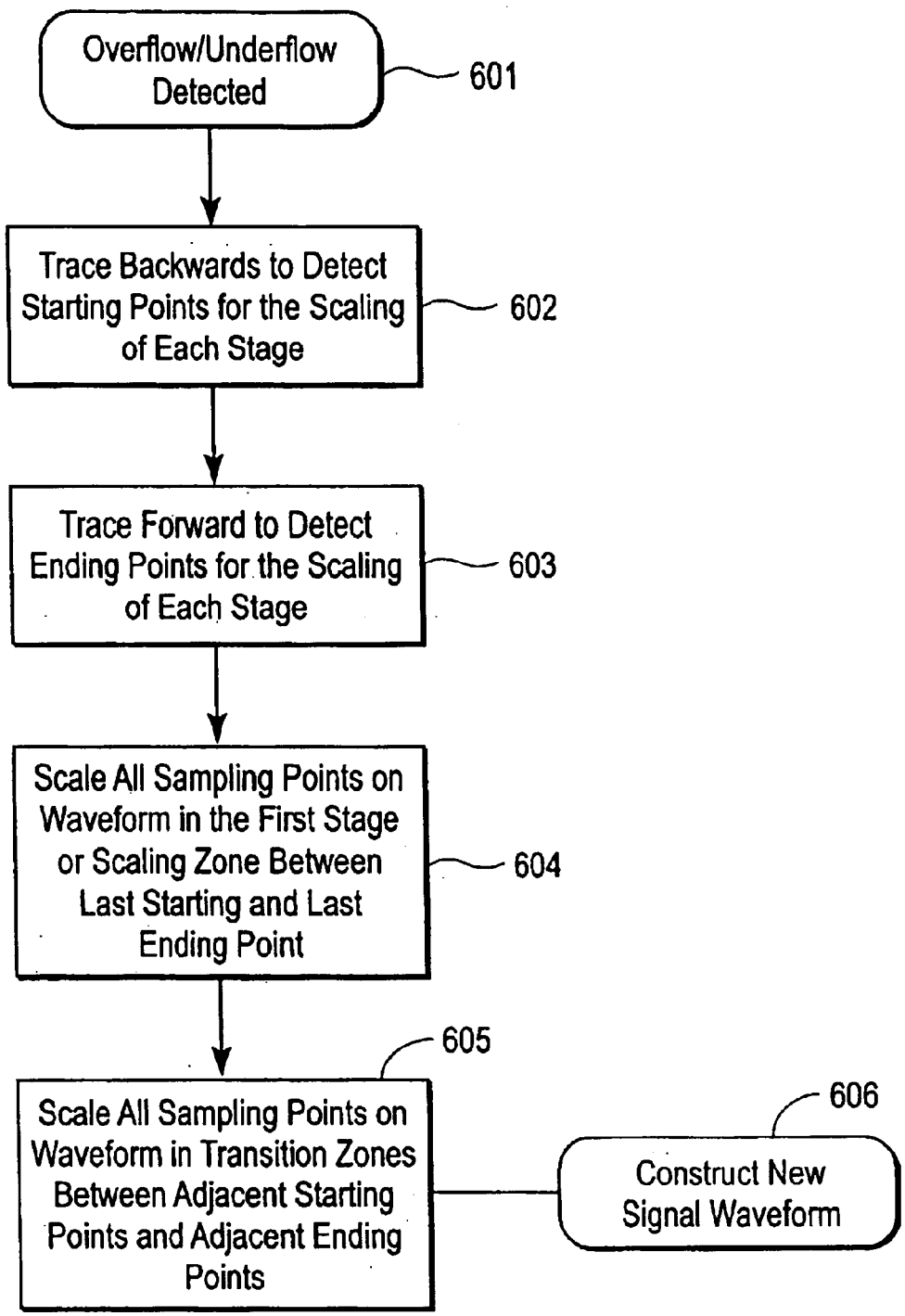
FIG. 6 illustrates a flowchart showing the steps in a preferred embodiment for rectifying underflow using a preferred embodiment of the multi-stage scaling solution

In the multi-stage scaling solution, each stage will be scaled or rectified in a fashion similar to the single stage scaling process. FIG. 6 illustrates a flowchart showing the steps in a preferred embodiment for rectifying overflow or underflow using a preferred embodiment of the multi-stage scaling solution. Once overflow/underflow is detected 601, starting points (550 and 560 in the overflow, 555 and 565 in the underflow) for the scaling of each stage will be located 602. Starting points are located with reference to the first and second thresholds T1$a$–$b$ and T2$a$–$b$, respectively. For example, starting point 550 will be the point where the audio signal is equal to the first positive threshold level T1$a$ in the overflow when tracing backwards along the audio signal waveform from the point where the overflow was first detected. Likewise, starting point 555 will be the point where the audio signal is equal to the first negative threshold level T1$b$ when tracing backwards along the audio signal waveform from the point where the underflow was first detected. Starting point 560 will be the point where the audio signal is equal to the second positive threshold level T2$a$ in the overflow when tracing backwards along the audio signal waveform from the point where the overflow was first detected. Likewise, starting point 565 will be the point where the audio signal is equal to the second negative threshold level T2$b$ when tracing backwards along the audio signal waveform from the point where the underflow was first detected.

Once starting points for each stage have been located, the next step in the multi-stage scaling solution for rectifying underflow is to locate ending points (580 and 590 in the overflow, 585 and 595 in the underflow) for each of the stages 603. Once again, it is understood that the multi-stage scaling process requires an equal number of starting and ending points, with the number of each being equal to the total number of stages to be scaled or rectified. The ending points serve as the last points where the scaling of each stage will occur. Ending points are located with reference to the first and second thresholds T1$a$–$b$ and T2$a$–$b$, respectively. For example, ending point 580 is defined as the point where the audio signal is equal to the first positive threshold value T1$a$ in the overflow when tracing forward along the audio signal waveform from a maximum positive peak value in the overflow, where the maximum positive peak value in the overflow is the point of greatest signal amplitude in the overflow portion of the signal. Likewise, ending point 590 is defined as the point where the audio signal is equal to the second positive threshold value T2$a$ in the overflow when tracing forward along the audio signal waveform from the maximum positive peak value in the overflow. Ending point 585 is defined as the point where the audio signal is equal to the first negative threshold value T1$b$ in the underflow when tracing forward along the audio signal waveform from a maximum negative peak value in the underflow, where the maximum negative peak value in the underflow is the point of greatest signal amplitude in the underflow portion of the signal. Likewise, ending point 595 is defined as the point where the audio signal is equal to the second negative threshold value T2$b$ in the underflow when tracing forward along the audio signal waveform from the maximum negative peak value in the underflow.

In the multi-stage scaling solution, the portion of the signal between the last starting point and the last ending point in either the overflow or underflow is known as the nth stage or scaling zone. Accordingly, the portion of the audio signal between starting point 560 and ending point 590 in the overflow and the portion of the audio signal between starting point 565 and ending point 595 in the underflow are the nth stages or scaling zones in the overflow/underflow. The next step in the multi-stage process is to scale the magnitude of each sampling point on the waveform in the scaling zones according to the following formula 604:

Output sample=(input sample−$T1$)*$Sn$*$S(n-1)$*$S(n-2)$ . . . —($Tn$−$T(n-1)$)*$Sn$+$Tn$ wherein n is equal to the total number of stages and wherein $S1$*$S2$* . . . $S(n)$=(Maximum Allowable Positive or Negative Signal Level−$Tn$)/(Positive or Negative Peak Value−$Tn$)

Accordingly, in our two stage example, the waveform in the 2nd stage or scaling zone would be scaled up according to the following formula:

Output sample=(input sample−$T1$)*$S2$*$S1$−($T2$−$T1$)*$S2$+$T2$ wherein n is equal to the total number of stages=2

In the multi-stage scaling solution, the portions of the signal between each of the adjacent starting points and the portions of the signal between each of the adjacent ending points (in the two stage example illustrated in FIG. 5 these would be the portions of the audio signal between adjacent starting points 550 and 560 and adjacent ending points 580 and 590 in the overflow, and the portions of the audio signal between adjacent starting points 555 and 565 and adjacent ending points 585 and 595 in the underflow) are known as the mth stage or transition zones. The next step in the multi-stage solution is to scale each of the sampling points on the audio waveform in the transition zones according to the following formula 605:

Output sample=(input sample−$Tm$)*$Sm$+$Tm$ wherein m is equal to the stage number Accordingly, in our two stage example, the waveform in the overflow transition zones would be scaled according to the following formula:

Output sample=(input sample−$T1$)*$S1$+$T1$ wherein m is equal to the stage number=1

Accordingly, after the audio levels of each sampling point in the transition zones have been reduced, a new audio signal is constructed, having a smooth signal curve with reduced overflow/underflow without clipping the audio signal levels (607). Using the multi-stage scaling solution of the present invention an effective multi-stage scaling solution is given wherein a signal having overflow or underflow is divided into stages within the overflow or underflow and each stage is scaled individually in order to effectively rectify the signal and maintain the signal integrity.

Figure 7:
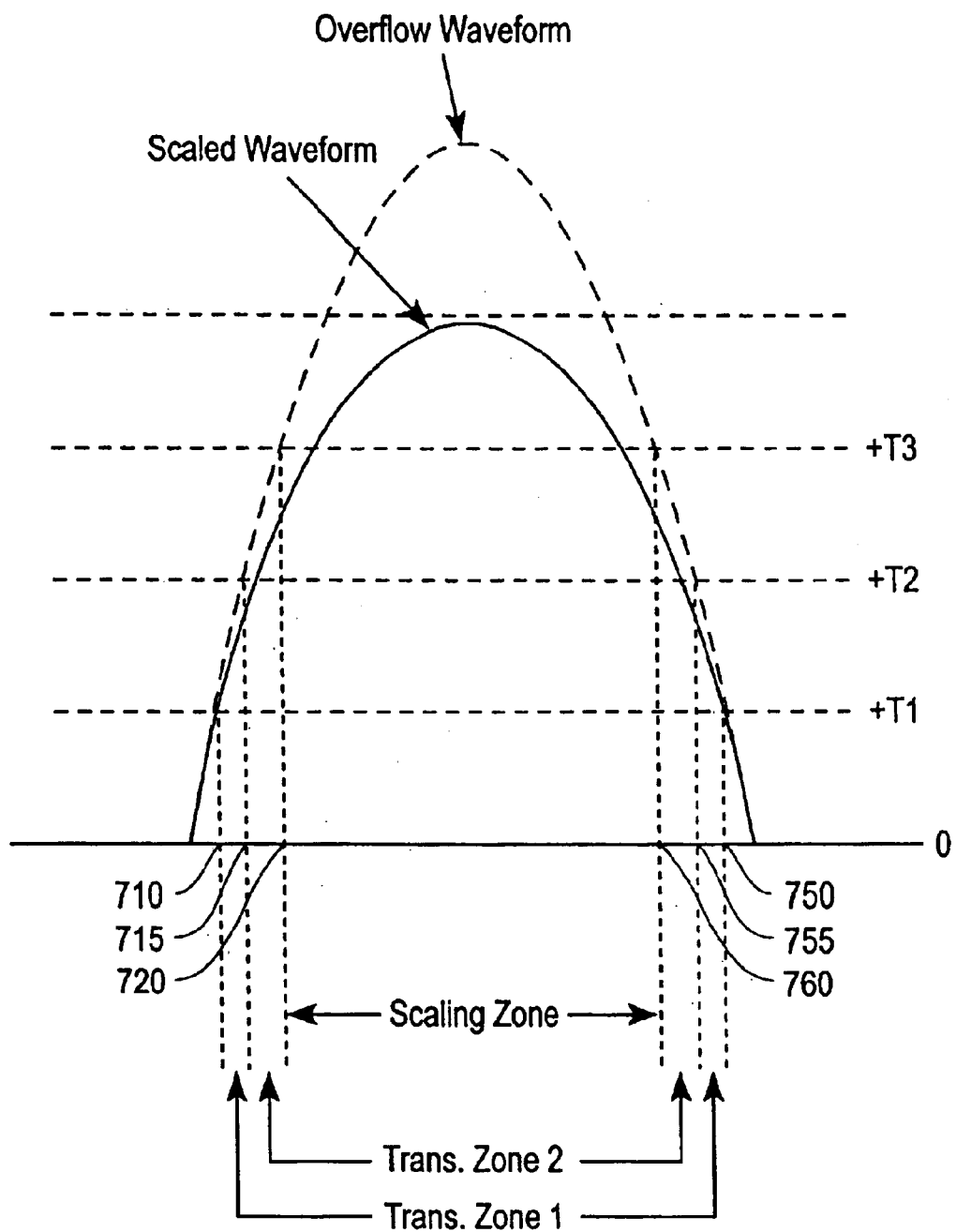
FIG. 7 illustrates a multi-stage solution for rectifying overflow using a three stage example.

FIG. 7 illustrates a multi-stage solution for rectifying overflow using a three stage example. Although FIG. 7 only illustrates a three stage solution for rectifying overflow, it is easily understood how the same would apply to rectifying underflow. In a three stage example, three upper thresholds T1, T2, and T3 are preferably set, with each upper threshold different from each other by the amount $\Delta X$ dB. Three separate starting points 710, 715 and 720 and three separate ending points 750, 755, 760 are chosen. Starting point 710 is equal to the point where the waveform crosses the first threshold value T1 when tracing back from the point where overflow is first detected, starting point 715 is equal to the point where the waveform crosses the second threshold value T2 when tracing back from the point where overflow is first detected, and starting point 720 is equal to the point where the waveform crosses the third threshold value T3 when tracing back from the point where overflow is first detected. Likewise, ending point 750 is equal to the point where the waveform crosses the first threshold value T1 when tracing forward from a maximum peak value in the overflow, ending point 755 is equal to the point where the waveform crosses the second threshold value T2 when tracing forward from a maximum peak value in the overflow, and ending point 760 is equal to the point where the waveform crosses the third threshold value T3 when tracing forward from a maximum peak value in the overflow.

As explained earlier, each stage will be scaled down separately using a separate scaling variable or multiplier. Accordingly, portions of the audio waveform which fall within transition zone 1 (between starting point 710 and starting point 715, and between ending point 750 and ending point 755) are preferably scaled down according to the following formula:

Output sample=(input sample−$T1$)*$S1$+$T1$

Portions of the audio waveform which fall within transition zone 2 (between starting point 715 and starting point 720, and between ending point 755 and ending point 760) are preferably scaled down according to the following formula:

Output sample=(input sample−$T1$)*$S1$*$S2$+($T1$−$T2$)*$S2$+$T2$

And, finally, portions of the audio signal which fall within the nth stage or scaling zone (between starting point 720 and ending point 760) are preferably scaled down according to the following formula:

Output sample=(input sample−$T1$)*$S1$*$S2$*$S3$+($T1$−$T2$)*$S2$*$S3$+ ($T2$−$T3$)*$S3$+$T3$ Wherein the values S1, S2 and S3 are scaling factors with the following preferred constraints:

$S1$*$S2$*$S3$=(Maximum allowable positive or negative signal level− $T3$)/(positive or negative peak value−$T3$)

$S3$=SQRT (Maximum allowable positive or negative signal level− $T3$)/(positive or negative peak value−$T3$)

It is understood that the multi-stage process can be extended to any higher number of stages without incurring too much overhead in processing time. Using the multi-stage process, the output audio signal waveform is much smoother and produces a much better output sound quality.

Unbalanced Scaling Solution

In both the single stage and multi-stage scaling solutions previously described, starting and ending points for each stage are calculated relative to the same threshold value. For example, in the single stage scaling solution the starting point for scaling overflow or underflow is determined by tracing back from the point where the overflow or underflow was first detected to the point where the audio signal waveform is equal to the upper or lower threshold values, respectively. The ending point is determined by tracing forward from a maximum peak value (overflow) or minimum peak value (underflow) to the point where the audio signal waveform is once again equal to the same threshold value. In some instances, however, it maybe desirable to use unbalanced or unequal threshold levels for determining the starting and ending points where the waveform of the audio signal is to be rectified.

Figure 8A:
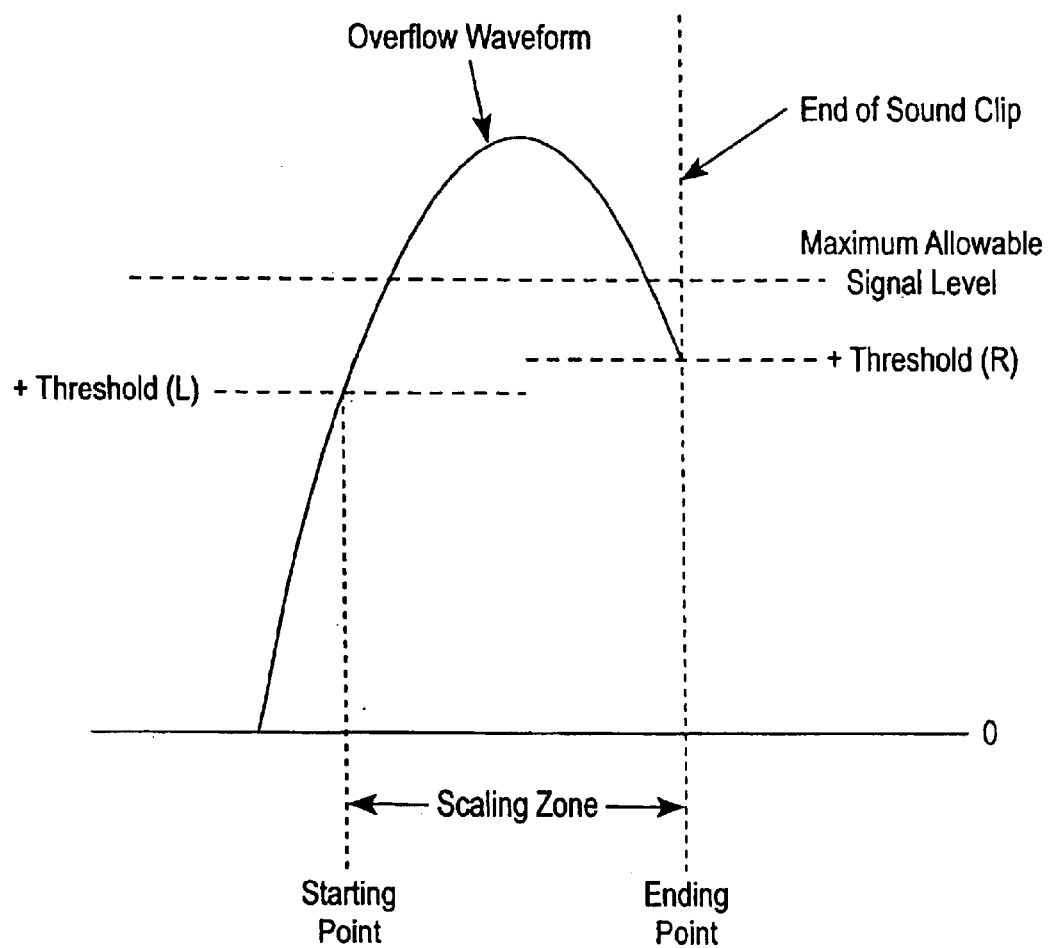
FIGS. 8a and 8b illustrate instances wherein it is desirable to use unbalanced or unequal threshold levels for determining the starting and ending points where the waveform of the audio signal is to be rectified.
Figure 8B:
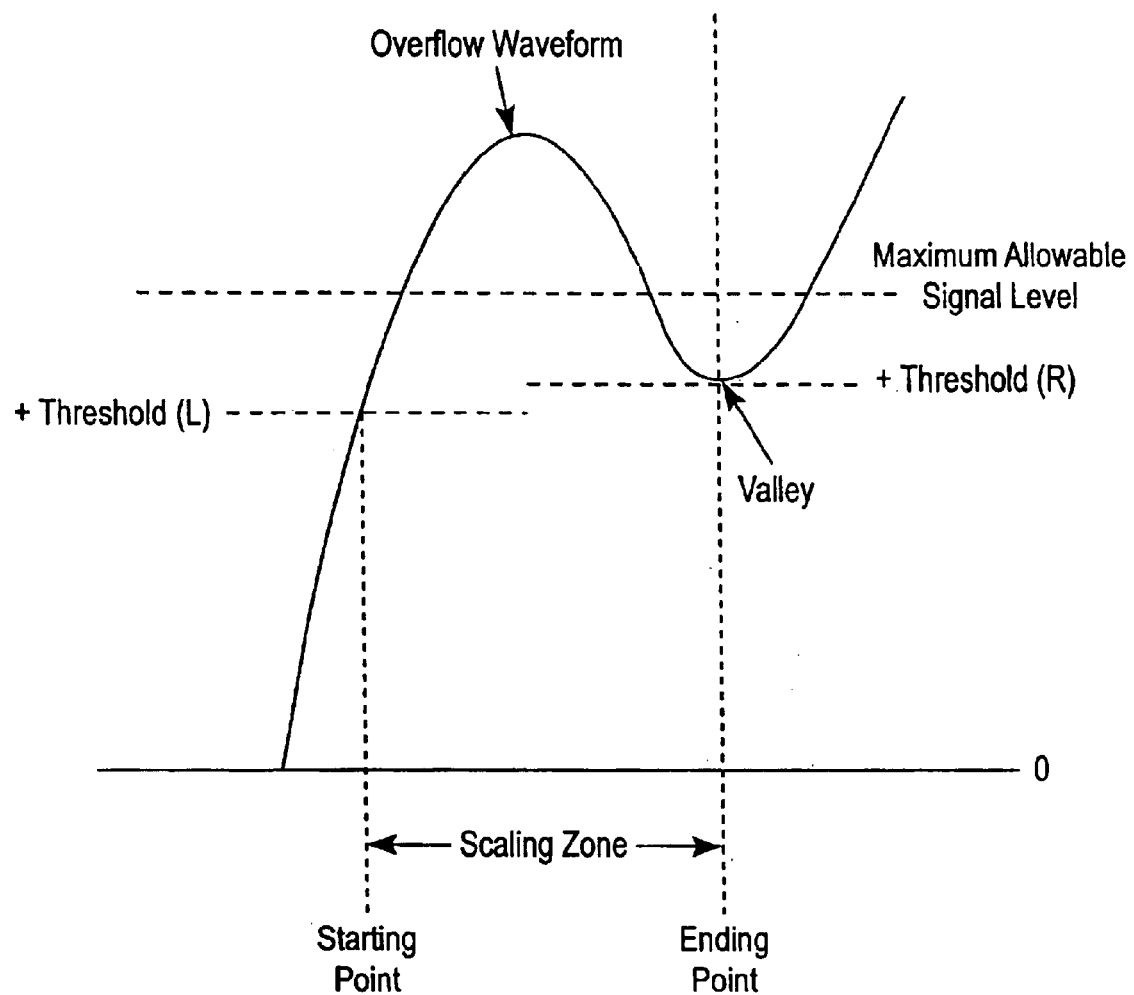

In some instances, the waveform may not crosses the same threshold value at various points such that each overflow or underflow portion can be effectively scaled or rectified using the same balanced threshold value. For example, overflow or underflow may occur in the waveform at the very beginning or the end of the audio sound clip. This situation is illustrated in FIG. 8a. Alternatively, the waveform may not follow a fairly sinusoidal shape; but, instead, may fluctuate above the threshold level for some period of time before crossing the threshold level once again. This situation is illustrated in FIG. 8b.

In both of these cases, it easy to see that either the single stage or multi-stage process, as described above, must be modified in order to effectively determine accurate starting or ending points, where the scaling is to stop. This is because the audio signal waveform does not cross over the same threshold value. In these unbalanced cases, wherein overflow or underflow occurs, the present invention preferably splits the waveform into two parts. A first part of the waveform is located between a beginning point and a maximum positive or negative peak value in the overflow or underflow, respectively. A second part of the waveform is located between the maximum positive or negative peak value in the overflow or underflow and an ending point. The starting and ending points are determined using different threshold levels. Each part of the waveform is then scaled down separately according to the corresponding threshold level and an appropriate right or left side scaling factor.

For example, in the case of overflow or underflow which occurs at the beginning or ending of the signal, the present invention will use unbalanced thresholds for determining starting and stopping points for the scaling of the audio signal waveform. The present invention will pick either the beginning (or ending) of the sound clip as one threshold value, assuming this point is less than the maximum positive or negative allowable value. A second unbalanced threshold is also chosen. Each of these values and the corresponding maximum positive or negative peak value (depending on whether the invention is rectifying overflow or underflow) are used to determine each side or part of the waveform to be scaled. One side or part of the waveform located between the starting point and the maximum peak value will be scaled using a first variable scaling factor and a second side or part of the waveform between the maximum peak value and the ending point will be scaled using a second variable scaling factor.

Figure 9:
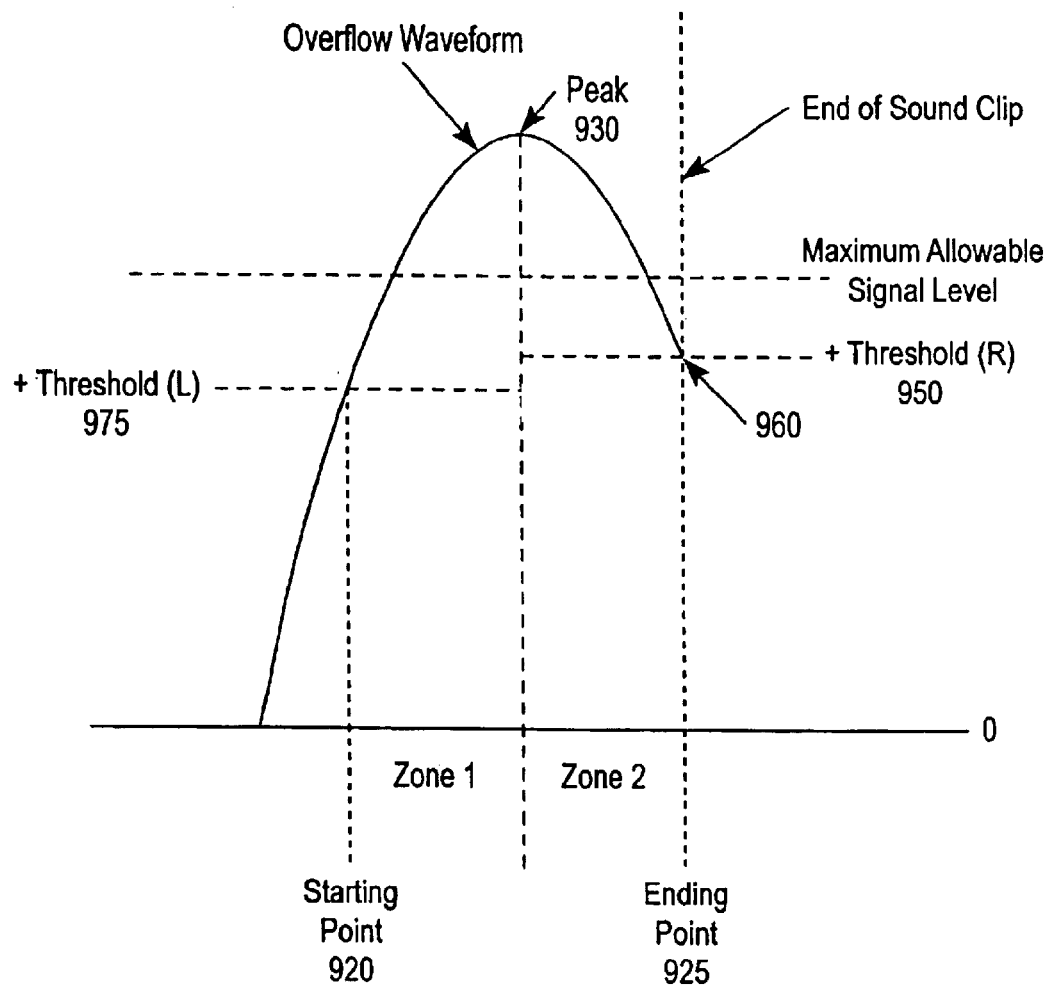
FIG. 9 illustrates an example for correcting overflow which occurs at the end of the signal in accordance with a preferred embodiment of the present invention.

Referring to FIG. 9, an example is shown for correcting overflow which occurs at the end of the signal in accordance with a preferred embodiment of the present invention. In order to rectify overflow occurring at the end of the audio signal, different right and left threshold values 950 and 975 need be used in order to determine starting and ending points 920 and 925 for scaling the audio signal. In the unbalanced waveform solution, the waveform is once again divided into stages but this time the stages will be divided from by time instead of amplitude.

In a preferred embodiment of the unbalanced waveform solution for rectifying overflow at the end of the audio signal, a left side threshold value TL is chosen as previously explained, keeping in mind the principles previously set forth. A higher threshold means less waveform alteration— i.e. less of the audio waveform will be attenuated or rectified as further described herein; but, a higher threshold also means the attenuation is distributed over a shorter time period. Likewise, a lower threshold value means more waveform alteration—i.e. more of the audio waveform will be attenuated or rectified as further described herein; but, a lower threshold value also means that the attenuation is distributed over a longer time period. Accordingly, the left side threshold value TL is preferably chosen in order to achieve the optimal balance between distribution over time and degree of attenuation needed. Additionally, a right side threshold value TR is also chosen, wherein the right side threshold value TR is the amplitude of the signal at the end or last point in the waveform.

After left and right side threshold values have been chosen TL and TR, the starting and ending points 920 and 925 are calculated. The starting point 920 serves as the beginning point for scaling of the overflow portion of the audio signal. The starting point 920 is defined as the point where the amplitude of the audio signal equals the left side threshold value TL when tracing backwards along the audio signal waveform from the point where the overflow was first detected. The ending point 925 serves as the last point where the scaling of the audio signal occurs. The ending point is defined as the point where the audio signal is equal to the right side threshold TR, when tracing forward along the audio signal waveform from a maximum peak value 930 in the overflow. The maximum peak value 930 is the highest amplitude value of the audio signal in the overflow portion.

Once the starting and ending points 920 and 925 have been chosen, the audio signal is divided into two separate portions and each portion is scaled individually using a different variable scaling factor. Referring again to FIG. 9, all sampling points located along the audio signal waveform in a scaling zone 1 between the starting point 920 and the maximum peak value 930 is scaled using a left side variable scaling factor. Preferably, the left side variable scaling factor is calculated as follows:

> Left Side Scaling Factor=(Maximum Allowable Positive or Negative Value–Positive or Negative Threshold Level)/(Maximum Positive or Negative Peak Value–Positive or Negative Left Threshold (TL) Level)

Likewise, all sampling points along the audio signal waveform located in a scaling zone 2 between the maximum peak value 930 and the ending point 925 are scaled using a right side variable scaling factor. The right side variable scaling factor is calculated as follows > Right Side Scaling Factor=(Maximum Positive or Negative Allowable Value–Positive or Negative Threshold Level)/(Maximum Positive or Negative Peak Value–Positive or Negative Right threshold(TR) Level)

Accordingly, after the audio levels of each sampling point in the scaling zones have been reduced, a new audio signal is constructed, having a smooth signal curve with reduced overflow/underflow without clipping the audio signal levels. Using the unbalanced threshold scaling solution of the present invention an effective solution for rectifying overflow/underflow is given wherein a signal having overflow or underflow is divided into stages within the overflow or underflow and each stage is scaled individually in order to effectively rectify the signal and maintain the signal integrity.

Figure 10:
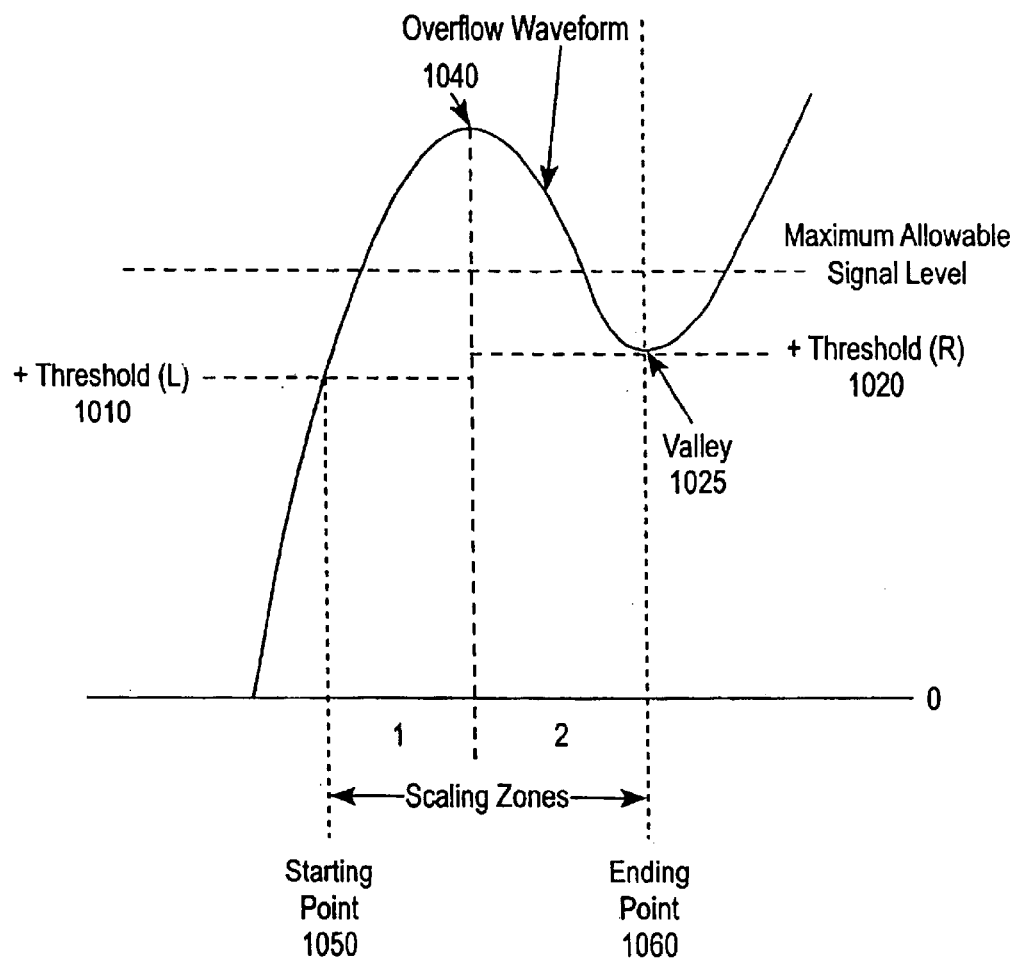
FIG. 10, an example is shown for correcting overflow in accordance with a preferred embodiment of the present invention, wherein the audio signal enters overflow but then never drops back down below the threshold value.

Referring to FIG. 10, an example is shown for correcting overflow in accordance with a preferred embodiment of the present invention, wherein the audio signal enters overflow but then never drops back down below the threshold value. Once again, in order to rectify this type of overflow situation, different left and right threshold values 1010 and 1020 need be used in order to determine starting and ending points 1050 and 1060 for scaling the audio signal. In the unbalanced waveform solution, the waveform will again be divided into different stages or zones divided temporally about a maximum positive (or negative in the case of underflow) peak value.

In a preferred embodiment of the unbalanced waveform solution for rectifying overflow of an audio signal like that shown in FIG. 10, a left side threshold value 1010 is chosen as previously explained, keeping in mind the principles previously set forth. A higher threshold means less waveform alteration—i.e. less of the audio waveform will be attenuated or rectified as further described herein; but, a higher threshold also means the attenuation is distributed over a shorter time period. Likewise, a lower threshold value means more waveform alteration—i.e. more of the audio waveform will be attenuated or rectified as further described herein; but, a lower threshold value also means that the attenuation is distributed over a longer time period. Accordingly, the left side threshold value 1010 is preferably chosen in order to achieve the optimal balance between distribution over time and degree of attenuation needed. Additionally, a right side threshold value 1020 is also chosen, wherein the right side threshold value 1020 is equal to the point where the audio signal waveform reaches its lowest point of amplitude 1025 before returning to overflow.

After left and right side threshold values 1010 and 1020 have been chosen, the starting and ending points 1050 and 1060 for the scaling zone are calculated. The starting point 1050 serves as the beginning point for scaling of the overflow portion of the audio signal. The starting point 1050 is defined as the point where the amplitude of the audio signal equals the left side threshold value 1010 when tracing backwards along the audio signal waveform from the point where the overflow was first detected. The ending point 1060 serves as the last point where the scaling of the audio signal occurs. The ending point 1060 is defined as the point where the audio signal is equal to the right side threshold value 1020, when tracing forward along the audio signal waveform from a maximum positive peak value 1040 in the overflow (or a maximum negative peak value in the case of underflow). The maximum peak value 1040 is the highest amplitude value of the audio signal in the overflow portion.

Once the starting and ending points 1050 and 1060 have been chosen, the audio signal is divided into two separate portions temporally and each portion is scaled individually using a different variable scaling factor. Referring again to FIG. 10, sampling points located on the audio signal waveform within a first scaling zone or part of the audio signal located between the starting point 1050 and the maximum peak value 1040 are scaled using a first variable scaling factor calculated as follows:

> First Scaling Factor=(Maximum Allowable Positive or Negative Value–Positive or Negative First Left Threshold (TL) Level)/ (Positive or Negative Peak Value–Positive or Negative Left Threshold (TL) Level)

Likewise, sampling points located on the audio waveform within a second second scaling zone or part of the audio signal located between the maximum peak value 1040 and the ending point 1060 is scaled using a second variable scaling factor calculated as follows > Second Scaling Factor=(Maximum Positive or Negative Allowable Value–Positive or Negative Second Threshold Level/(Maximum Positive or Negative Peak Value–Positive or Negative Right Threshold(TR) Level)

Accordingly, sampling points in portions of the audio signal located before and after the maximum peak value are each individually scaled for overflow. Preferably, the unbalanced scaling solution can be easily extended into a multistage solution for smoother waveform and better output sound quality, wherein there can be multiple stages or zones on both sides of the maximum positive peak value (or negative peak value in the case of underflow) such that each stage or zone is scaled using a distinct variable scaling factor.

In a preferred embodiment wherein the present invention is implemented in software executable by a processor, the software is preferably stored in a memory device and is comprised of any number of modules design to enable a processor to perform the single stage, multi-stage and unbalanced methods discussed above. For example, the software may include a threshold selection module for selecting the appropriate upper and lower thresholds and determining starting and stopping points for scaling each stage. A separate signal rectification module may be used to generate the scaling factors or variables for each stage and multiplying the sampling points in stage by the appropriate scaling factor or variable.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

What is claimed is:

1. A method for rectifying overflow or underflow of an audio signal including a number of sampling points forming a representative waveform, the method comprising:

selecting a positive or negative threshold level which represents an amplitude value which is less than a maximum acceptable amplitude for the audio signal; and rectifying the audio signal where the representative waveform has an amplitude which exceeds the amplitude value of the positive or negative threshold level so as to eliminate the overflow or underflow.

2. The method of claim 1, wherein the step of rectifying the audio signal comprises:

detecting a starting point where the rectifying of the audio signal begins;

detecting an ending point where the rectifying of the audio signal ends; and scaling the sampling points on the waveform between the starting point and the ending point.

3. The method of claim 2, wherein the steps of detecting the starting and ending points comprise:

determining an initial point where the overflow or the underflow of the audio signal begins;

tracing back along the waveform and detecting a first point where the waveform is equal to the threshold level, said first point being designated as the starting point;

detecting a peak value of the audio signal in the overflow or underflow; and tracing forward along the waveform from the peak value and detecting a second point where the waveform is equal to the threshold level, said second point being designated as the ending point.

4. The method of claim 2, wherein the step of scaling the scaling points on the waveform between the starting point and the ending point comprises:

subtracting the threshold level from an original amplitude value for each sampling point, thereby generating an amplitude difference for each sampling point;

multiplying the amplitude difference for each sampling point by a scaling factor thereby generating a scaled amplitude difference for each sampling point; and adding the threshold level to the scaled amplitude difference for each sampling point thereby generating a final amplitude for each sampling point.

5. The method of claim 4, wherein the scaling factor is equal to the maximum acceptable amplitude less the amplitude value of the positive or negative threshold level, divided by a peak value in the overflow or underflow less the amplitude value of the positive or negative threshold level.

6. The method of claim 5 wherein:

the maximum acceptable amplitude is a positive value in the case of overflow or a negative value in the case of underflow; and the peak value is a positive value in the case of overflow or a negative value in the case of underflow.

7. A method for rectifying overflow of an audio signal including a number of sampling points forming a representative waveform, the method comprising:

selecting n upper threshold levels representing n different positive signal amplitudes that are less than a maximum acceptable amplitude; and rectifying the audio signal where the representative waveform has an amplitude exceeding any of the positive signal amplitudes of the n upper threshold levels so as to eliminate any overflow.

8. The method of claim 7, wherein the step of rectifying the audio signal comprises:

detecting a first starting point and a first ending point;

detecting a second starting point and a second ending point;

scaling the sampling points on the waveform between the first starting point and the second starting point and the sampling points on the waveform between the first ending point and the second ending point; and scaling the sampling points on the waveform between the second starting point and the second ending point.

9. The method of claim 8, wherein the step of detecting the first starting point and the first ending point comprises:

determining an overflow start point where overflow of the audio signal begins;

tracing back along the waveform from the overflow start point and detecting a first point where the amplitude of the waveform is equal to a first upper threshold value, said first point being designated as the first starting point;

detecting a maximum peak value of the audio signal in the overflow; and tracing forward along the waveform from the maximum peak value and detecting a second point where the amplitude of the waveform is equal to the first upper threshold value, said second point being designated as the first ending point.

10. The method of claim 9, wherein the step of detecting the second starting point and the second ending point comprises:

determining the overflow start point where overflow of the audio signal begins;

tracing back along the waveform from the overflow start point and detecting a third point where the amplitude of the waveform is equal to a second upper threshold value, said third point being designated as the second starting point;

detecting a maximum peak value of the audio signal in the overflow; and tracing forward from the maximum peak value along the waveform and detecting a fourth point where the amplitude of the waveform is equal to the second upper threshold level, said fourth point being designated as the second ending point.

11. A method for rectifying underflow of an audio signal including a number of sampling points forming a representative waveform, the method comprising:

selecting n lower threshold levels representing n different negative signal amplitudes that are less than a maximum acceptable negative amplitude; and rectifying the audio signal where the representative waveform has a negative amplitude exceeding any of the negative signal amplitudes of the n lower threshold levels so as to eliminate any underflow.

12. The method of claim 11, wherein the step of rectifying the audio signal is comprised of:

detecting a first starting point and a first ending point;

detecting a second starting point and a second ending point;

scaling the sampling points on the waveform between the first starting point and the second starting point and the sampling points on the waveform between the first ending point and the second ending point; and scaling the sampling points on the waveform between the second starting point and the second ending point.

13. The method of claim 12, wherein the step of detecting the first starting point and the first ending point comprises:

determining an underflow start point where underflow of the audio signal begins;

tracing back along the waveform and detecting a first point where the amplitude of the waveform is equal to a first lower threshold value, said first point being designated as the first starting point;

detecting a maximum negative peak value of the audio signal in the underflow; and tracing forward along the waveform and detecting a second point where the amplitude of the waveform is equal to the first lower threshold value, said second point being designated as the first ending point.

14. The method of claim 13, wherein the step of detecting the second starting point and the second ending point comprises:

determining the underflow start point where underflow of the audio signal begins;

tracing back along the waveform and detecting a third point where the amplitude of the waveform is equal to a second lower threshold value, said third point being designated as the second starting point;

detecting a maximum negative peak value of the audio signal in the underflow; and tracing forward along the waveform and detecting a fourth point where the amplitude of the waveform is equal to the second lower threshold value, said fourth point being designated as the second ending point.

15. A method for rectifying overflow or underflow occurring in an audio signal including a number of sampling points forming a representative waveform, the method comprising:

detecting a maximum peak value of the audio signal in the overflow or underflow;

selecting a positive or negative left side threshold representing a first amplitude value which is less than a maximum acceptable amplitude for the audio signal;

selecting a positive or negative right side threshold representing a second amplitude value which is less than the maximum acceptable amplitude for the audio signal and different from the first amplitude value;

rectifying a portion of the audio signal of which an amplitude is between the left side threshold and the maximum peak value; and rectifying a portion of the audio signal of which the amplitude is between the right side threshold and the maximum peak value.

16. The method of claim 15, wherein the step of rectifying a portion of the audio signal of which an amplitude is between the left side threshold and the maximum peak value comprises:

detecting a starting point by tracing back along the waveform from a first point where overflow or underflow first occurs to second point where the amplitude of the waveform is equal to the left threshold value, the second point being the starting point; and scaling the sampling points on the representative waveform between the starting point and the maximum peak value.

17. The method of claim 15, wherein the step of rectifying a portion of the audio signal of which the amplitude is between the right side threshold and the maximum peak value comprises:

detecting an ending point by tracing forward along the waveform from the maximum peak value to a first point where the amplitude of the waveform is equal to the right threshold value, the first point being the ending point; and scaling the sampling points on the representative waveform between the maximum peak value and the ending point.

18. The method of claim 15 wherein:

the maximum acceptable amplitude is a positive value in the case of overflow or a negative value in the case of underflow; and the maximum peak value is a positive value in the case of overflow or a negative value in the case of underflow.

19. A computer program product comprising:

a computer useable medium having computer readable code embodied therein for rectifying overflow or underflow of an audio signal including a number of sampling points forming a representative waveform, the computer readable code executable by a processor and comprising:

a threshold selection module for selecting a positive or negative threshold level which represents an amplitude value below a maximum acceptable amplitude for the audio signal; and a signal rectification module for rectifying the audio signal where the representative waveform has an amplitude which exceeds the amplitude value of the positive or negative threshold level so as to eliminate the overflow.

20. The computer program product of claim 19, wherein the signal rectification module causes the processor to:

detect a starting point;

detect an ending point; and scale the sampling points on the waveform between the staring point and the ending point.

21. The computer program product of claim 20, wherein the signal rectification module causes the processor to detect the starting and ending points by:

determining an overflow or underflow start point where overflow or underflow of the audio signal begins;

tracing back along the waveform from the overflow or underflow start point and detecting a first point where the amplitude of the waveform is equal to the threshold value, said first point being designated as the starting point;

detecting a maximum peak value of the audio signal in the overflow or underflow; and tracing forward along the waveform from the maximum peak value and detecting a second point where the amplitude of the waveform is equal to the threshold value, said second point being designated as the ending point.

22. The computer program product of claim 20, wherein the signal rectification module causes the processor to scale the sampling points on the waveform by:

subtracting the threshold level from an Currently amended amplitude value for each sampling point, thereby generating an amplitude difference for each sampling point;

multiplying the amplitude difference for each sampling point by a scaling factor thereby generating a scaled amplitude difference for each sampling point; and adding the threshold level to the scaled amplitude difference for each sampling point thereby generating a final amplitude for each sampling point.

23. The method of claim 22, wherein the scaling factor is equal to the maximum acceptable amplitude less the amplitude value of the positive or negative threshold level, divided by a peak value in the overflow or underflow less the amplitude value of the positive or negative threshold level.

24. The method of claim 22 wherein:

the maximum acceptable amplitude is a positive value in the case of overflow or a negative value in the case of underflow; and the peak value is a positive value in the case of overflow or a negative value in the case of underflow.

25. A computer program product comprising a computer useable medium having computer readable code embodied therein for rectifying overflow of an audio signal including a number of sampling points forming a representative waveform, the computer readable code executable by a processor and comprising:

a threshold selection module for selecting n upper threshold levels representing n different positive signal amplitudes that are less than a maximum acceptable amplitude; and a signal rectification module for rectifying the audio signal where the representative waveform has an amplitude exceeding any of the positive signal amplitudes of the n upper threshold levels so as to eliminate any overflow.

26. The computer program product of claim 25, wherein the signal rectification module causes the processor to:

detect a first starting point and a first ending point;

detect a second starting point and a second ending;

scale the sampling points on the waveform between the first starting point and the second starting point and the sampling points on the waveform between the first ending point and the second ending point; and scale the sampling points on the waveform between the second starting point and the second ending point.

27. The computer program product of claim 26, wherein the signal rectification modules causes the processor to detect the first starting point and the first ending point by:

determining an overflow start point where overflow of the audio signal begins;

tracing back along the waveform from the overflow start point and detecting a first point where the amplitude of the waveform is equal to a first upper threshold value, said first point being designated as the first starting point;

detecting a maximum peak value of the audio signal in the overflow; and tracing forward along the waveform from the maximum peak value and detecting a second point where the amplitude of the waveform is equal to the first upper threshold level, said second point being designated as the first ending point.

28. The computer program product of claim 27, wherein the signal rectification modules causes the processor to detect the second starting point and the second ending point by:

determining the overflow start point where overflow of the audio signal begins;

tracing back along the waveform from the overflow start point and detecting a third point where the amplitude of the waveform is equal to a second upper threshold value, said third point being designated as the second starting point;

detecting a maximum peak value of the audio signal in the overflow; and tracing forward along the waveform from the maximum peak value and detecting a fourth point where the amplitude of the waveform is equal to the second upper threshold level, said fourth point being designated as the second ending point.

29. A computer program product comprising:

a computer useable medium having computer readable code embodied therein for rectifying underflow of an audio signal including a number of sampling points forming a representative waveform, the computer readable code executable by a processor and comprising:

a threshold selection module for selecting n lower threshold levels representing n different negative signal amplitudes that are less than a maximum acceptable negative amplitude; and a signal rectification module for rectifying the audio signal where the representative waveform has an amplitude greater than any of the negative signal amplitudes of the n lower threshold levels so as to eliminate any underflow.

30. The computer program product of claim 29, wherein the signal rectification modules causes the processor to:

detect a first starting point and a first ending point;

detect a second starting point and a second ending point;

scale the sampling points on the waveform between the first starting point and the second starting point and the sampling points on the waveform between the first ending point and the second ending point; and scale the sampling points on the waveform between the second starting point and the second ending point.

31. The computer program product of claim 30, wherein the signal rectification modules causes the processor to detect the first starting point and the first ending point by:

determining an underflow start point where underflow of the audio signal begins;

tracing back along the waveform from the underflow start point and detecting a first point where the amplitude of the waveform is equal to a first lower threshold value, said first point being designated as the first starting point;

detecting a maximum negative peak value of the audio signal in the underflow; and tracing forward along the waveform from the minimum peak value and detecting a second point where the amplitude of the waveform is equal to the first lower threshold value, said second point being designated as the first ending point.

32. The computer program product of claim 31, wherein the signal rectification modules causes the processor to detect the second starting point and the second ending point by:

determining the underflow start point where underflow of the audio signal begins;

tracing back along the waveform from the underflow start point and detecting a third point where the amplitude of the waveform is equal to a second lower threshold value, said third point being designated as the second starting point;

detecting a maximum negative peak value of the audio signal in the underflow; and tracing forward along the waveform from the maximum negative peak value and detecting a fourth point where the amplitude of the waveform is equal to the second lower threshold value, said fourth point being designated as the second ending point.

33. An apparatus for rectifying overflow or underflow of an audio signal including a number of sampling points forming a representative waveform, comprising:

a threshold selection module for selecting a positive or negative threshold level which represents an amplitude value which is less than a maximum acceptable amplitude for the audio signal; and a signal rectification module for rectifying the audio signal where the representative waveform has an amplitude which exceeds the amplitude value of the positive or negative threshold level so as to eliminate the overflow or underflow.

34. The apparatus of claim 33, wherein the signal rectification module:

detects a starting point;

detects an ending point; and scales the sampling points on the waveform between the starting point and the ending point.

35. The apparatus of claim 34, wherein the signal rectification module detects the starting and ending points by:

determining an overflow or underflow start point where overflow or underflow of the audio signal begins;

tracing back along the waveform from the overflow or underflow start point and detecting a first point where the amplitude of the waveform is equal to the threshold level, said first point being designated as the starting point;

detecting a peak value of the audio signal in the overflow or underflow; and tracing forward along the waveform from the peak value and detecting a second point where the waveform is equal to the threshold level, said second point being designated as the ending point.

36. The apparatus of claim 34 wherein the signal rectification module scales the sampling points on the waveform by:

subtracting the threshold level from an original amplitude value for each sampling point, thereby generating an amplitude difference for each sampling point;

multiplying the amplitude difference for each sampling point by a scaling factor thereby generating a scaled amplitude difference for each sampling point; and adding the threshold level to the scaled amplitude difference for each sampling point thereby generating a final amplitude for each sampling point.

37. The apparatus of claim 36, wherein the scaling factor is equal to the maximum acceptable amplitude less the amplitude value of the positive or negative threshold level, divided by a peak value in the overflow or underflow less the amplitude value of the positive or negative threshold level.

38. The apparatus of claim 37 wherein:

the maximum acceptable amplitude is a positive value in the case of overflow or a negative value in the case of underflow; and the peak value is a positive value in the case of overflow or a negative value in the case of underflow.

39. An apparatus for rectifying overflow of an audio signal including a number of sampling points forming a representative waveform, the apparatus comprising:

a threshold selection module for selecting n upper threshold levels representing n different positive signal amplitudes that are less than a maximum acceptable amplitude, wherein each of the n upper threshold levels differ from each other by a same degree; and a signal rectification module for rectifying the audio signal where the representative waveform has an amplitude exceeding any of the positive signal amplitudes of the n upper threshold levels so as to eliminate any overflow.

40. The apparatus of claim 39, wherein the signal rectification module:

detects a first starting point where the waveform of the audio signal rises above a first upper threshold level in the n upper threshold levels and a first ending point where the waveform of the audio signal falls below the first upper threshold level in the n upper threshold levels;

detects a second starting point where the waveform of the audio signal rises above a second upper threshold level in the n upper threshold levels and a second ending point where the waveform of the audio signal falls below the first upper threshold level in the n upper threshold levels;

scales the sampling points on the waveform between the first starting point and the second starting point and the sampling points on the waveform between the first ending point and the second ending point by multiplying each sampling point by a first scaling factor; and scales the sampling points on the waveform between the second starting point and the second ending point by multiplying each sampling point on the waveform by a second scaling factor.

41. The apparatus of claim 40, wherein the signal rectification modules detects the first starting point and the first ending point by:

determining an overflow start point where overflow of the audio signal begins;

tracing back along the waveform and detecting a first point where the waveform is equal to the first upper threshold value, said first point being designated as the first starting point;

detecting a maximum peak value of the audio signal in the overflow; and tracing forward along the waveform and detecting a second point where the waveform is equal to the first upper threshold value, said second point being designated as the first ending point.

42. The apparatus of claim 41, wherein the signal rectification modules detects the second starting point and the second ending point by:
   determining the overflow start point where overflow of the audio signal begins;
   tracing back along the waveform and detecting a third point where the waveform is equal to the second upper threshold value, said third point being designated as the second starting point;
   detecting a maximum peak value of the audio signal in the overflow; and
   tracing forward along the waveform and detecting a fourth point where the waveform is equal to the second upper threshold value, said fourth point being designated as the second ending point.

43. An apparatus for rectifying underflow of an audio signal including a number of sampling points forming a representative waveform, the computer readable code executable by a processor and comprising:
   a threshold selection module for selecting n lower threshold levels representing n different negative signal amplitudes, wherein each of the n lower threshold levels differ from each other by a same degree; and
   a signal rectification module for rectifying the audio signal where the representative waveform has a negative amplitude exceeding any of the negative signal amplitudes of the n lower threshold levels so as to eliminate any underflow.

44. The apparatus of claim 43, wherein the signal rectification module:
   detects a first starting point where the waveform of the audio signal falls below a first lower threshold level in the n lower threshold levels and a first ending point where the waveform of the audio signal rises above the first lower threshold level in the n lower threshold levels;
   detects a second starting point where the waveform of the audio signal falls below a second lower threshold level in the n lower threshold levels and a second ending point where the waveform of the audio signal rises above the second lower threshold level in the n lower threshold levels;
   scales the sampling points on the waveform between the first starting point and the second starting point and the sampling points on the waveform between the first ending point and the second ending point by multiplying each sampling point by a first scaling factor; and
   scales the sampling points on the waveform between the second starting point and the second ending point by multiplying each sampling point on the waveform by a second scaling factor.

45. The apparatus of claim 44, wherein the signal rectification modules detects the first starting point and the first ending point by:
   determining an underflow start point where underflow of the audio god signal begins;
   tracing back along the waveform and detecting a first point where the waveform is equal to the first lower threshold value, said first point being designated as the first starting point;
   detecting a minimum peak value of the audio signal in the underflow; and
   tracing forward along the waveform and detecting a second point where the waveform is equal to the first lower threshold value, said second point being designated as the first ending point.

46. The apparatus of claim 45, wherein the signal rectification modules detects the second starting point and the second ending point by:
   determining the underflow start point where underflow of the audio signal begins;
   tracing back along the waveform and detecting a third point where the waveform is equal to the second lower threshold value, said third point being designated as the second starting point;
   detecting a minimum peak value of the audio signal in the underflow; and
   tracing forward along the waveform and detecting a fourth point where the waveform is equal to the second lower threshold value, said fourth point being designated as the second ending point.

* * * * *

UNITED STATES PATENT AND TRADEMARK OFFICE
CERTIFICATE OF CORRECTION

PATENT NO. : 6,795,740 B1
DATED : September 21, 2004
INVENTOR(S) : Ke Chiang Chu, Hong Kaura and James Peter Hoddie It is certified that error appears in the above-identified patent and that said Letters Patent is hereby corrected as shown below:

Title page,
Item [75], Inventors, after "Hong Kaura", please delete "San Jose" and insert
-- Sunnyvale --.
After "James Peter Hoddie", please delete "Mountain View" and insert
-- Menlo Park --.
Item [74], *Attorney, Agent, or Firm*, please delete "Fenwick & West, LLP" and insert
-- Fenwick & West LLP --.
Item [57], ABSTRACT,
Line 23, please delete "another, section" and insert -- another section --.

Column 16,
Line 15, please delete "occurs to second point" and insert -- occurs to a second point --.

Signed and Sealed this

Twenty-third Day of November, 2004

JON W. DUDAS
*Director of the United States Patent and Trademark Office*